United States Patent [19]

Scarbrough

[11] 3,769,702

[45] Nov. 6, 1973

[54] 3D-COAXIAL MEMORY CONSTRUCTION AND METHOD OF MAKING

[75] Inventor: Alfred D. Scarbrough, Northridge, Calif.

[73] Assignee: Bunker Ramo Corporation, Oak Brook, Ill.

[22] Filed: Aug. 9, 1972

[21] Appl. No.: 278,923

Related U.S. Application Data

[62] Division of Ser. No. 111,476, Feb. 1, 1971, Pat. No. 3,704,455.

[52] U.S. Cl. .......................... 29/627, 29/626, 29/589

[51] Int. Cl. .......................... H05k 3/28

[58] Field of Search .......................... 29/626, 627, 589, 29/576 J

[56] References Cited

UNITED STATES PATENTS

| | | | |
|---|---|---|---|
| 3,383,564 | 5/1968 | Lalmond | 29/626 |
| 3,351,702 | 11/1967 | Stephens | 29/627 |
| 3,372,309 | 3/1968 | Stockdale | 29/626 |
| 3,465,435 | 9/1969 | Steranko | 29/626 |

*Primary Examiner*—Richard J. Herbst
*Assistant Examiner*—Tupman
*Attorney*—Frederick M. Arbuckle

[57] ABSTRACT

A semiconductor memory in which integrated circuit chips each contain semiconductor flip-flop memory elements are mounted to respective ones of a plurality of batch-fabricated, pressure-stacked electrically conductive wafers so as to form a compact, essentially all metal, three-dimensional memory structure. Coaxially-shielded X, Y and Z conductors are formed in the conductive wafers by selective chemical etching for expeditiously providing the interconnections required for the integrated circuit chips in accordance with the desired memory organization.

8 Claims, 10 Drawing Figures

PATENTED NOV 6 1973 3,769,702

SHEET 4 OF 5

3D-COAXIAL MEMORY CONSTRUCTION AND METHOD OF MAKING

This is a division of application Ser. No. 111,476, filed Feb. 1, 1971, now U.S. Pat. No. 3,704,455.

BACKGROUND OF THE INVENTION

This invention relates generally to means and methods for packaging memories of the type intended for use in digital data processing systems, and more particularly to semiconductor memories employing semiconductor memory elements provided on integrated circuit chips and the like. As is well known, considerable difficulties have heretofore been encountered in attempting to package such semiconductor memories so as to provide for the very large number of electrical interconnections required while at the same time permitting the desired memory operating characteristics to be reliably achieved at reasonable cost.

SUMMARY OF THE INVENTION

In accordance with the present invention, improved means and methods are disclosed for packaging semiconductor memories and the like in a manner so as to permit obtaining an economical, compact and fully shielded overall structure having excellent heat dissipation properties, very low noise and cross-talk, and a high operating speed capability. These features are achieved in an exemplary embodiment of the invention in which integrated circuit chips containing the semiconductor memory elements are mounted to respective ones of a plurality of batch fabricated, pressure-stacked, electrically conductive wafers which are constructed so as to form a three-dimensional memory structure having all of its required interconnections provided by coaxial X, Y and Z paths formed within the stack.

The specific nature of the invention as well as other objects, features, advantages and uses thereof will become apparent from the following description of an examplary embodiment of the invention taken in conjunction with the accompanying drawings in which.

Like numerals designate like elements throughout the figures of the drawings.

Figure 1:
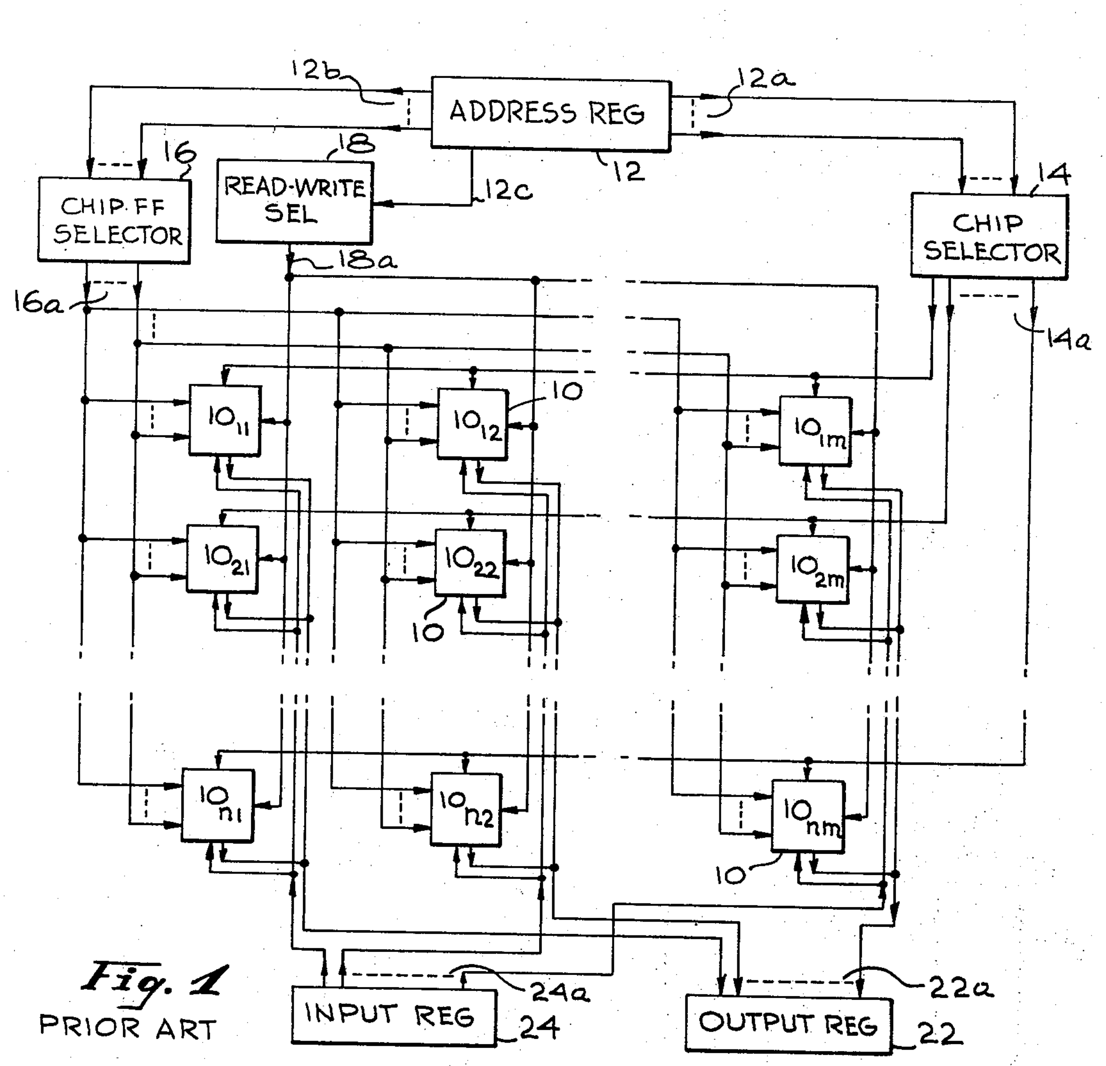
Fig. 1 PRIOR ART
FIG. 1 is an electrical block and circuit diagram of a typical semiconductor memory which may be packaged in accordance with the invention.

Referring initially to FIG. 1, illustrated therein is a typical conventional form of semiconductor memory which may advantageously be packaged in accordance with the invention. Such a semiconductor memory typically comprises binary digital memory elements provided by flip-flop semiconductor memory cells contained on integrated circuit chips 10, the design of a typical chip being illustrated in FIG. 2. For illustrative purposes and later identification, the integrated circuit chips 10 in FIG. 1 are shown in a row-column functional arrangement with each chip 10 being given a two number subscript designating its row-column location, the first number indicating the row and the second number indicating the column. Thus, the upper left integrated circuit chip is designated at $\mathbf{10}_{11}$ indicating it is located in row 1 and column 1.

As also illustrated in FIG. 1, an address register 12 provides respective signals 12*a*, 12*b* and 12*c* to a chip selector 14, a chip flip-flop selector 16, and a read-write selector 18. These operate in a conventional manner to provide respective signals 14*a*, 16*a* and 18*a* to the chips 10 for enabling a selected row of chips and a selected flip-flop on each chip of the selected row, and then initiating a read or write operation with respect to each of the thus enabled flip flops. If a read operation is to performed, the output of each enabled flip-flop is applied to an output register 22 via a respective one of the output lines 22*a*. If a write operation is to be performed, each enabled flip-flop is set in accordance with an input register 24 via a respective one of the input lines 24*a*. It will be understood that, in accordance with well known practice, the memroy of FIG. 1 may, for example, be organized so that the enabled flip-flops on the selected row correspond to the bits of a particular word in the memory. For such an organization, the flip-flops contained in each row of chips in the memory of FIG. 1 will then correspond to the bits of a particular plurality of different words stored in the memory, and each column of chips will correspond to bits of like significance. Obviously, other types of memory organizations may also be employed.

Figure 2:
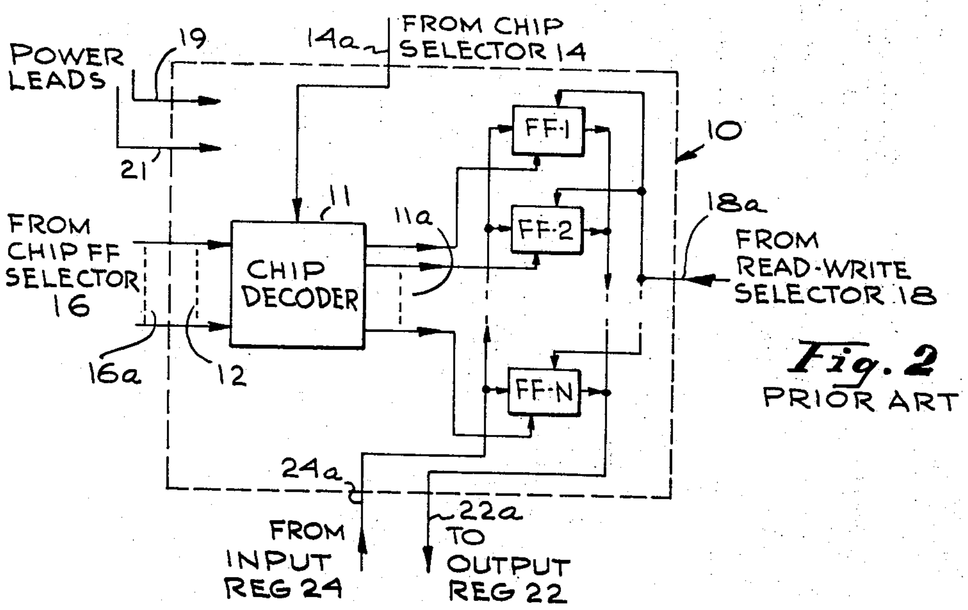
Fig. 2 PRIOR ART
FIG. 2 is an electrical block and circuit diagram of one of the integrated circuit chips of the semiconductor memory of FIG. 1.

Reference is now directed to FIG. 2 which illustrates a typical circuit arrangement which may be employed for each of the integrated circuit chips 10 in FIG. 1. As shown, each chip 10 may typically include a plurality of individually selectable bistable flip-flops FF–1 to FF–N serving as the binary digital memory elements of the memory. A chip decoder 11 is also provided on each chip 10 and, when enabled by a respective signal 14*a* from the chip selector 14, operates to enable a selected one of the flip-flops via a respective line 11a chosen in accordance with the signals 16*a* provided from the chip flip-flop selector 16. It will be understood that the thus enabled flip-flop operates in a conventional manner in response to a signal 18a from the read-write selector 18 to either transfer its existing state via its respective line 22*a* to the output register 22 if a read operation is called for, or to conform its state to that indicated by a signal on its respective line 24*a* from the input register 24 if a write operation is called for.

It will also be understood from FIG. 2 that the flip-flops FF–1 to FF–N and the chip decoder 11 on each chip 10 may be provided using well known semiconductor integrated circuitry. It will further be understood that power is suitably supplied to the chips 10 in a well known manner via power leads 19 and 21.

Figure 3:
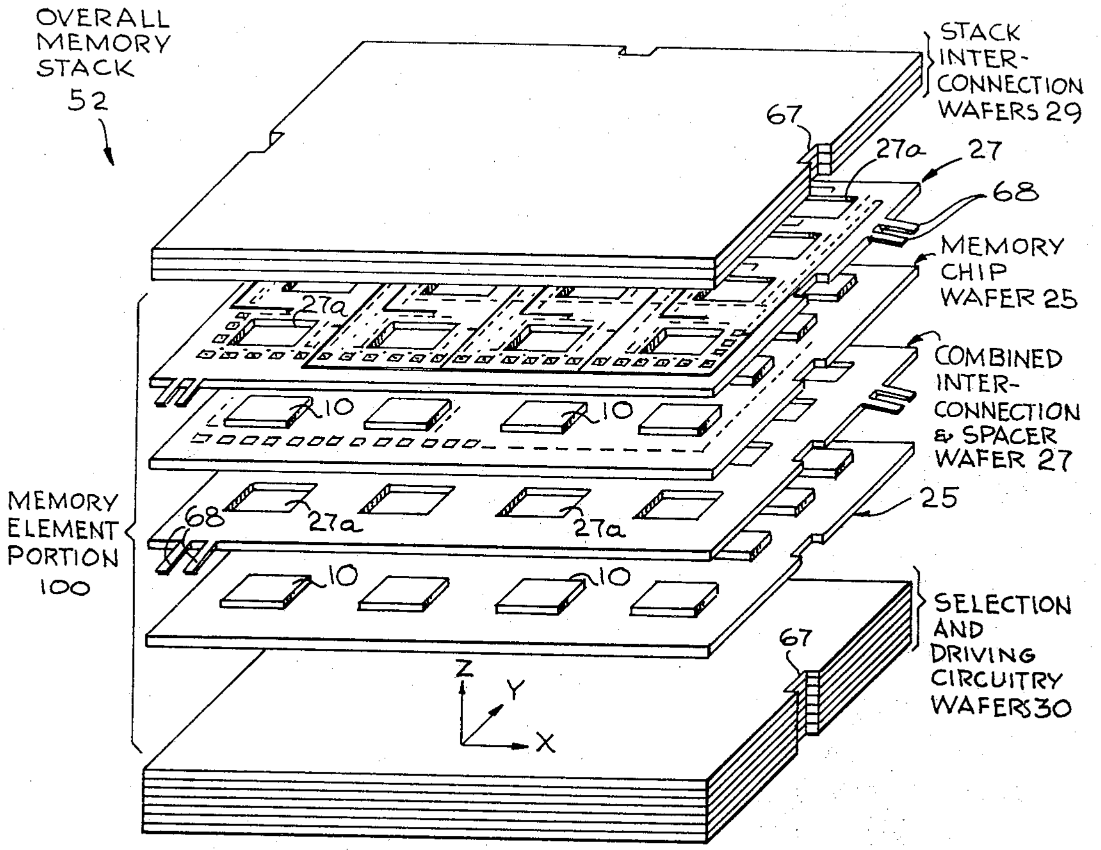
FIG. 3 is a disassembled perspective view of a multi-wafer semiconductor memory structure in accordance with the invention.
Figure 4:
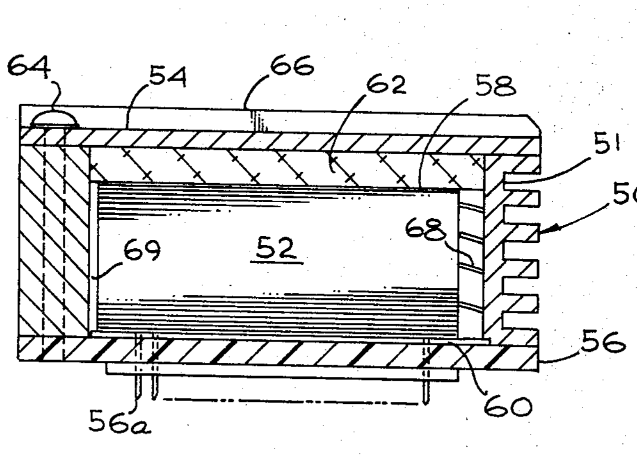
FIG. 4 is a sectional view illustrating how the multi-wafer memory structure of FIG. 3 may be contained within a housing in accordance with the invention.

Attention is next directed to FIGS. 3 and 4 which generally illustrate a preferred embodiment of the multi-wafer packaging approach of the present invention, and which may advantageously be employed for packaging the exemplary semiconductor memory illustrated in FIGS. 1 and 2. As will be evident from FIG. 3, the preferred embodiment of the packaging approach of the invention is implemented by stacking a multiplicity of specially formed conductive wafers of various types to form an overall memory stack 52 including a memory element portion 100 sandwiched between stack interconnection wafers 29 and selection and driving circuitry wafers 30 provided at the top and bottom of the stack. The memory element portion 100 is comprised of an alternating arrangement of memory chip wafers 25 and combined interconnection and spacer wafers 27.

Figure 5:
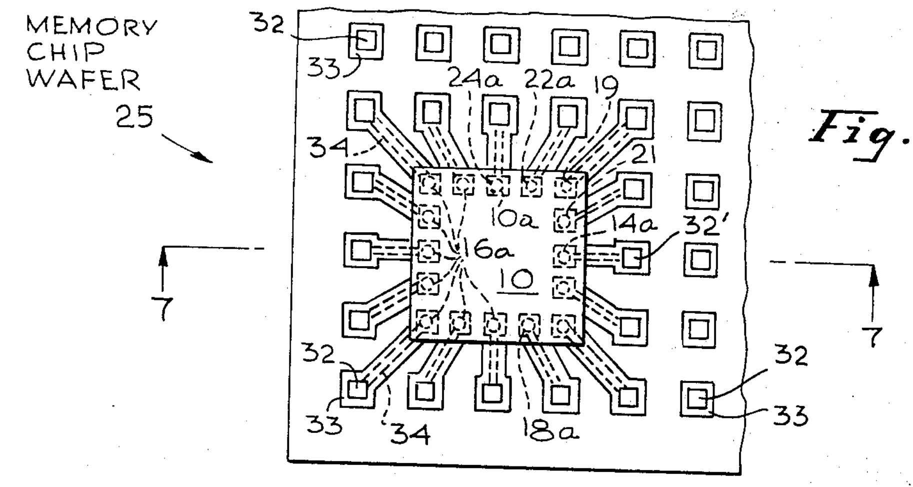
FIG. 5 is a fragmentary plan view illustrating a portion of a chip wafer in accordance with the invention.
Figures 6, 7:
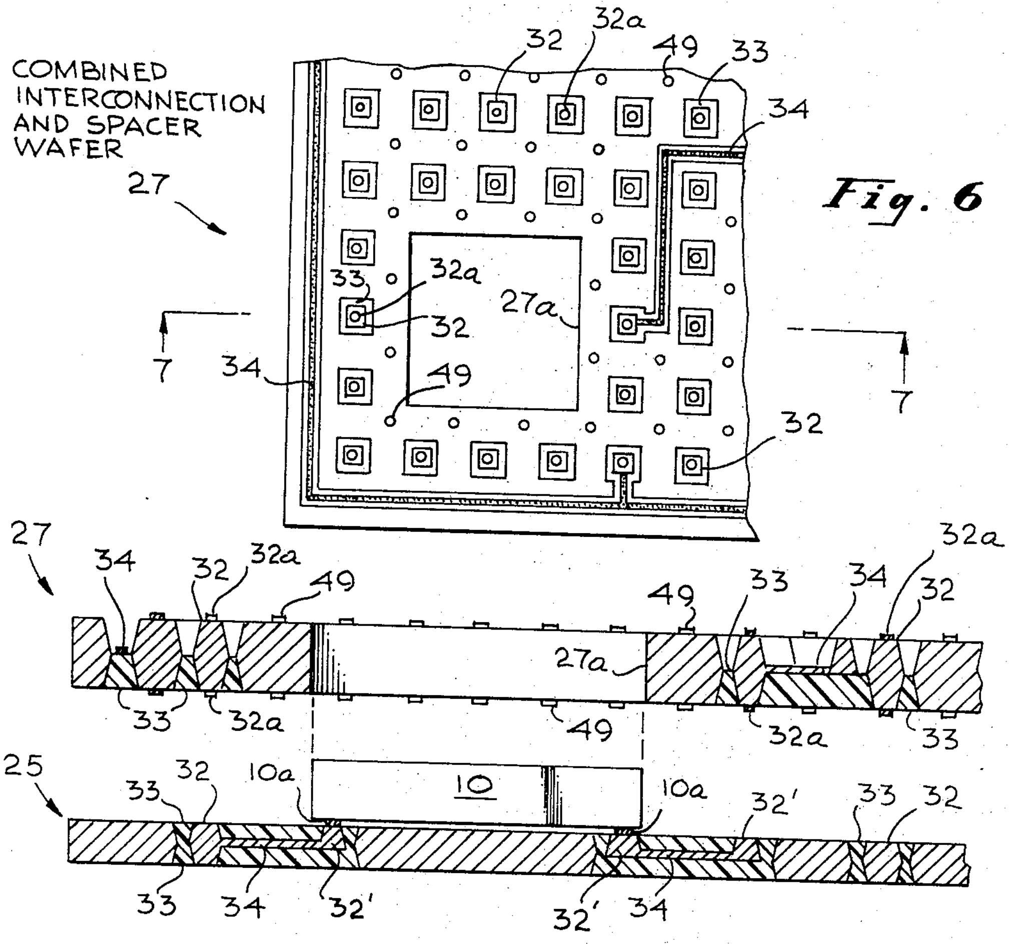
FIG. 6 is a fragmentary plan view illustrating a portion of combined interconnection and spacer wafer in accordance with the invention.
FIG. 7 is a disassembled sectional view taken along the lines 7—7 in FIGS. 5 and 6 illustrating the manner in which a combined wafer cooperates with a respective memory chip wafer to provide X, Y and Z interconnections in accordance with the invention.

Reference is now particularly directed to FIGS. 5 and 7 for describing a preferred construction and arrangement for a memory chip wafer 25. It is to be understood that, although not necessary, all chip wafers 25 are preferably of identical construction for greater economy in fabrication. As shown, each chip wafer 25 serves to support and provide electrical connection to a plurality of, for example, 16 integrated circuit chips 10 in, for example, a 4 × 4 matrix arrangement. As best illustrated in FIGS. 5 and 7, each chip wafer 25 comprises a conductive plate or wafer having spaced insulated Z-axis terminals 32 and 32′ surrounding the chips 10. The great majority of these Z-axis terminals are through-terminals extending from one surface to the other surface of the wafer and are indicated in the drawings by the reference number 32. As will be seen from FIG. 7, a relatively small number of the Z-axis terminals provided in the memory chip wafer 25 are not through-terminals, and these are indicated in the drawings by the reference number 32′. The reasons why these Z-axis terminals 32′ are provided in addition to the Z-axis through-terminals 32 will become evident at the description progresses.

It will further be seen from FIGS. 5 and 7 that each memory chip wafer 25 also includes a plurality of insulated conductors 34 (hereinafter referred to as X-Y conductors 34) formed in the plane of the wafer 25 and within the surfaces thereof for providing electrical connections between chip output terminals 10a and respective ones of the Z-axis terminals 32 and 32′, and also between predetermined ones of the Z-axis terminals 32 and 32′ of different chips. As shown, the Z-axis terminals 32 and 32′ and the X-Y conductors 34 are supported in and electrically insulated from the wafer 25 by dielectric 33.

Figure 8:
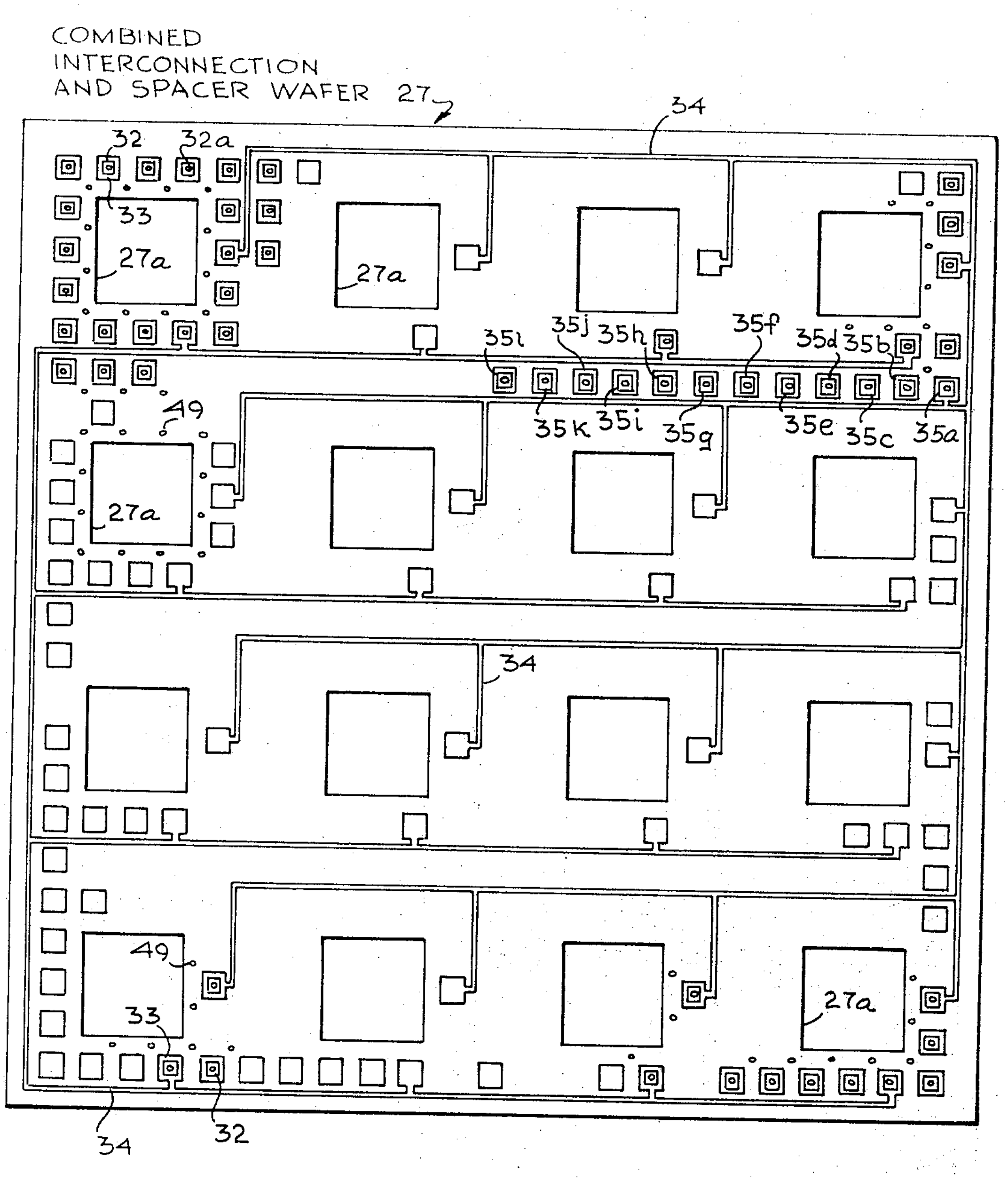
FIG. 8 is a plan view of a combined interconnection and spacer wafer illustrating a typical X-Y interconnection arrangement which may be provided thereon in accordance with the invention.

Next to be considered with particular reference to FIGS. 6–8 is a preferred construction and arrangement for a combined interconnection and spaced wafer 27. As generally illustrated in FIG. 3, these combined wafers 27 are provided in an alternating relationship with the chip wafers 25 within the memory element portion 100 of the stack 52. The specific manner in which a chip wafer 25 and a combined wafer 27 cooperate with one another is shown in the disassembled view of FIG. 7. Each combined wafer 27 serves to provide appropriate recesses 27*a* and spacings for a respective adjacent memory chip wafer 25, and also has Z-axis terminals 32 provided therein (all of which are through-terminals) respectively aligned with the Z-axis terminals 32 and 32′ of its respective memory chip wafer 25. Although all of the Z-axis terminals in the particular exemplary combined wafer 27 being considered herein are through-terminals, it will be understood the Z-axis terminals which are not through-terminals, such as provided for the chip wafer 25, could also be provided for the combined wafer 27.

Each combined wafer 27 also provides X-Y plane conductors 34, similar to those provided on the memory chip wafer 25, for interconnecting predetermined Z-axis terminals 32 thereof. In particular, FIG. 8 shows how X-Y conductors 34 may typically be provided on a combined wafer 27 for respectively connecting in common two predetermined Z-axis terminals of all chips. A similar X-Y conductor arrangement may also typically be provided on a chip wafer 25.

As best shown in FIGS. 6 and 7, both sides of each Z-axis through-terminal 32 of the combined wafer 27 are additionally provided with malleable contacts 32*a* of more ductile material than that used for the Z-axis terminals 32. Similar malleable contacts 49 are also provided on the remaining metal surfaces on both sides of the wafer 27. These malleable contacts 32*a* and 49 permit the Z-axis interconnections required for the wafers as well as the ground connections between wafers to be achieved with high reliability when the wafers are pressure-stacked using a housing, such as illustrated in FIG. 4 and to be described hereinafter. Although not necessary, it is advantageous that the housing contain the entire overall memory stack 52 shown in FIG. 3 so that all of the required interconnections and circuitry, including those required for the associated selection and driving circuitry, can be expeditiously provided in the same housing. The stack interconnection wafers 29 illustrated in FIG. 3 are preferably also included in order to provide for any additional interconnections which may be required for the integrated circuit memory chips 10 besides those providable within the memory element portion 100, and each may have a construction similar to that of a combined wafer 27 with the recesses 27a being omitted, if desired. The selection and driving circuitry wafers 30 may comprise a plurality of wafers constructed in a manner generally similar to the memory chip and combined wafers 25 and 27 with appropriate integrated circuit chips for performing the selection and driving functions being substituted for the integrated circuit memory chips 10. Also, it is most advantageous to provide the same aligned Z-axis terminal pattern on these additional wafers 29 and 30 as is provided on the wafers of the memroy element portion 100 so as to provide for uniform pressure distribution throughout the stack as well as expeditious communication of Z-axis connections among the wafers, and thereby make possible convenient accessibility of electrical connections at the end of the stack for testing purposes and/or connection to external circuitry.

A still further advantage of the memory construction of the present invention is that each of the resulting Z-axis connections as well as each of the X-Y connections in the memory stack 52 will be coaxially shielded throughout their length. It will be understood that each Z-axis connection will be coaxial since each Z-axis terminal is completely surrounded by the peripheral conductive material of the wafers through which it passes, the malleable contacts 49 provided between adjacent wafers insuring that good wafer-to-wafer ground connections are achieved for this purpose after pressure-stacking. Although not so readily evident, each X-Y conductor will also be coaxially shielded because, after stacking, the shielding provided by adjacent conductive wafers will combine with the shielding provided by the surrounding conductive portions of the wafer within which each X-Y conductor is contained to effectively provide complete coaxial shielding therefor. Of course, the number, size and spacing of the Z-axis terminals and the X-Y conductors formed in the various conductive wafers are appropriately chosen with respect to the desired operating frequency range so that this complete coaxial shielding of the X, Y and Z interconnections within the stack is achieved.

Referring now to FIG. 4, illustrated therein is a preferred form of housing 50 which may be employed for providing pressure-stacking of the overall memory stack 52 illustrated in FIG. 3, and also for providing output terminals **56*a* therefor. It will be seen from FIG. 4 that the housing 50 includes walls 51 and top and bottom cover plates 54 and 56, and that the overall memory stack 52 of FIG. 3 is disposed in the housing 50 between a top pressure plate 58 and an output connctor wafer 60 provided adjacent the bottom cover plate 56. The memory stack 52 is held under pressure in the Z-axis direction by a resilient pressure plate 62 provided adjacent the top cover plate 54 and bearing against the pressure plate 58 as a result of the compressive action produced by bolts such as 64 acting on the cover plates 54 and 56. Also, in order to permit convenient lateral alignment of the memory stack 52 in the housing 50, the wafers may be provided with keyways 67 (FIG. 3) adapted to mate with key projections 69 provided within the housing 50.**

Still with reference to FIG. 4, it will be understood that the bottom cover plate 56, which is of insulative material, has output terminal pins 56a molded therein and electrically coupled to the overall memory stack 52 via Z-axis through-terminals (not shown) provided in the output connector wafer 60, thereby permitting convenient electrical connection of the stack 52 of external circuitry. The housing walls 51 and the top cover plate 54 of the housing 50 are preferably provided with spaced elongated fins 66 projecting perpendicularly outwardly therefrom for the purpose of facilitating heat transfer from the housing 50 to the surrounding cooling medium. In order to maximize heat transfer from the memory stack 52 to the housing walls 51, a plurality of the wafers in the memory stack 52, for example, the combined wafers 27 in FIG. 2, are preferably provided with integral resilient fingers 68 which contact the inner surface of the housing walls 51 when the memory stack 52 is inserted therein. Of course, the transfer of large quantities of heat from the memory stack 52 is made possible in the first instance because the memory construction of the invention results in a stack which is essentially all metal.

Figures 9, 10:
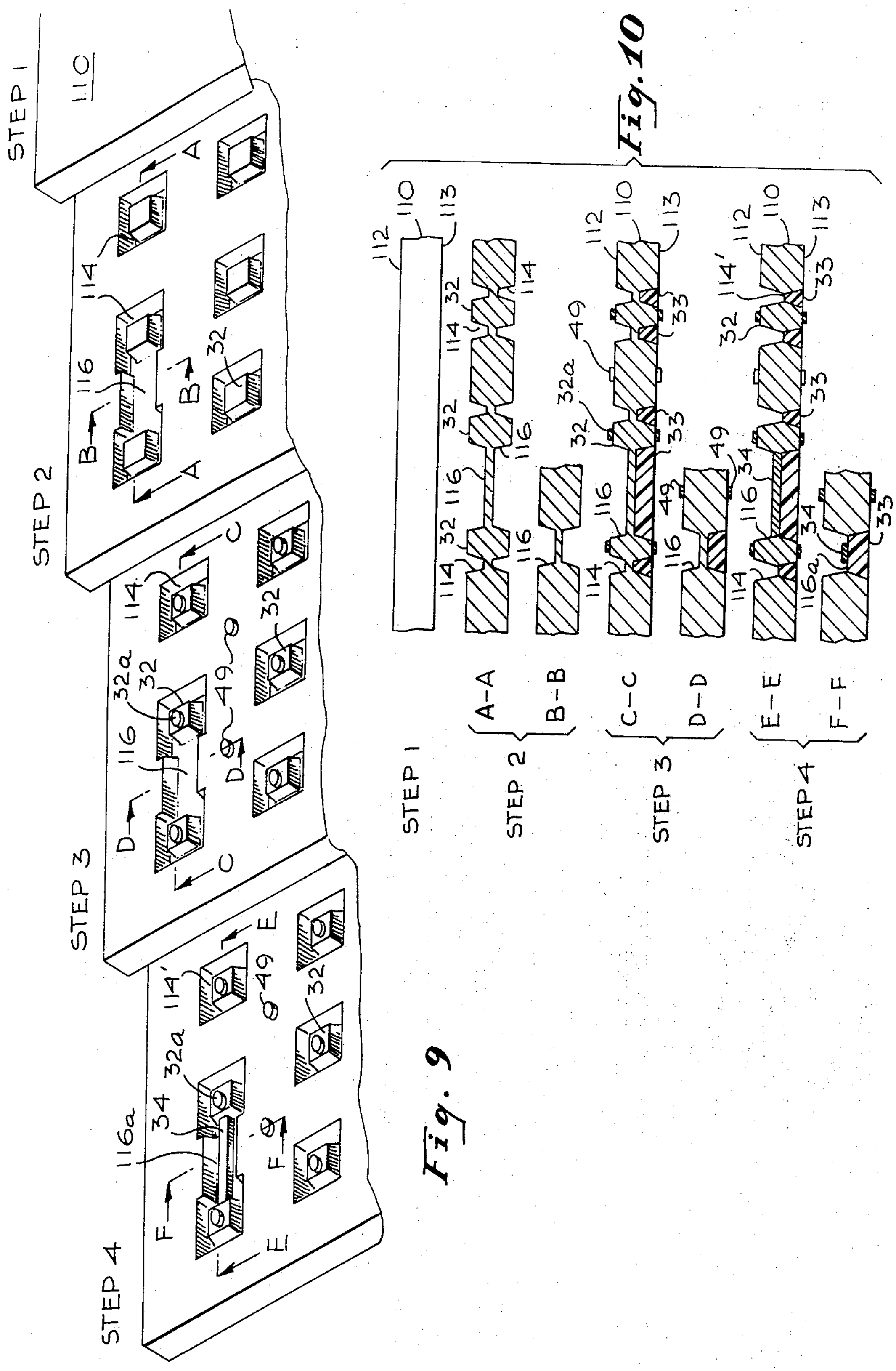
FIG. 9 is a plurality of fragmentary perspective views illustrating steps in the fabrication of a combined interconnection and spacer wafer in accordance with the invention.
FIG. 10 is a plurality of fragmentary cross-sectional views taken along the lines A—A, B—B, C—C, D—D, E—E, F—F, and G—G in FIG. 9.

Attention is next directed to the fabrication steps illustrated in FIGS. 9 and 10 which will be used to describe how a combined interconnection and spacer wafer 27 such as shown in FIGS. 3 and 6–8 may preferably be fabricated in accordance with the invention.

As indicated by Step 1 of FIGS. 9 and 10, a conductive wafer 110 of appropriate dimensions and with the desired recesses is first provided, such as by cutting a copper sheet to size. As indicated by Step 2, the wafer 110 is then selectively chemically etched in accordance with the Z-axis terminal and X-Y conductor pattern desired for the wafer. Selective chemical etching techniques are, of course, well known in the art. It will thus be understood from Step 2 that opposed Z-axis channels 114 are etched in opposite wafer surfaces for each Z-axis through-terminal to be provided, and opposed elongated X-Y conductor channels 116 are etched in opposite wafer surfaces for each X-Y conductor to be provided, the path of the opposed elongated channels 116 being chosen to correspond to that desired for the resulting X-Y conductor. For simplification, the X-Y conductor shown in Step 2 is illustrated as extending between a pair of adjacent Z-axis terminals, but, of course, could be chosen to extend between any other desired Z-axis terminal.

As illustrated by Step 3 in FIGS. 9 and 10, the channels 114 and 116 in the bottom wafer surface 113 are then filled with dielectric material 33 which is ground flush with the bottom wafer surface 113. Malleable contacts **32*a* and 49 are then provided, such as by electroplating, on both ends of the Z-axis through-terminals 32** and also on the remaining portions of the wafer.

As shown in Step 4 of FIGS. 9 and 10, selective chemical etching is then again employed to further etch the channels 114 and 116 on the top wafer surface 112 in a manner so as to form the desired Z-axis through-terminals 32 and X-Y conductors 34 in the wafer. More specifically, with regard to the further etching of the X-Y conductor channels 116 in the top wafer surface 112, it will best be understood from the cross-sectional view F—F of FIG. 10 that this further selective chemical etching forms side grooves **116*a* in each X-Y conductor channel 116 which extend to the dielectric material 33 in the opposing channel 116 so as to thereby form the desired X-Y conductor 34 within the wafer and electrically isolated therefrom. With regard to the further etching of the Z-axis channels 114 in the top wafer surface 112, it will best be understood from the cross-sectional view E—E of FIG. 10 that each such Z-axis channel is further etched so as to extend to the dielectric material 33 in the opposing Z-axis channel and thereby from the desired Z-axis through-terminal 32** within the wafer and electrically isolated therefrom.

It will be understood that the wafer obtained after completing Step 4 in FIGS. 9 and 10 may be used as the combined wafer 27 illustrated in FIGS. 6 and 7. The dielectric 33 provided in the channels 114 and 116 of the bottom wafer surface 113 during Step 3 serves to provide adequate support as well as electrical insulation for the resulting Z-axis through-terminals 32 and X-Y conductors 34. It will be appreciated that, although not necessary, the procedure could be adapted so that, during Step 3, dielectric is provided in the channels of the top wafer surface as well as in the bottom wafer surface. Alternatively, the procedure could be appropriately modified so that dielectric is provided in the channels of the top wafer surface instead of the bottom wafer surface.

It will also be appreciated that basically the same procedure illustrated in FIGS. 9 and 10 for forming the Z-axis terminals and X-Y conductors of the combined wafer 27 may also be used for the memory chip wafer 25. One significant difference is that the malleable contacts 32*a* and 49 provided in Step 3 of FIGS. 9 and 10 are omitted when making the memory chip wafer 25 since they are not required. The omission of these malleable contacts 32*a* and 49 simplifies the provision of dielectric 33 in the channels of both surfaces of the memory chip wafer 25. As illustrated in FIG. 7, dielectric 33 is thus preferably provided in both surfaces of the chip wafer 25, thereby insuring that all of the malleable contacts 32*a* and 49 of an adjacent combined wafer 27 will contact a common surface having no openings, thereby maintaining a high uniformity of pressure distribution. Another significant difference which will be evident from FIG. 7 is in the provision of the Z-axis terminals 32'. Each of these terminals 32' may be formed similar to a X-axis through-terminal 32 except that, during the formation of the adjacent X-Y conductor channels in Step 2 of FIGS. 9 and 10, the end of the lower conductor channel 116 adjacent each such terminal is extended under the terminal so that only the upper half thereof remains, thereby providing the desired terminal 32', such as shown, for example, in FIG. 7 for receiving a respective one of the chip output terminals 10*a.*

Having described in connection with FIGS. 3–10 how a semiconductor memory may typically be constructed and fabricated in accordance with the invention, it will next be described how such a construction may, for example, be applied to the conventional semiconductor memory diagrammatically illustrated in FIGS. 1 and 2. For this purpose, an exemplary arrangement will be assumed in which each memory chip wafer 25 (FIG. 3) contains all of the chips 10 corresponding to a respective row of chips in FIG. 1 with the chips on each wafer being arranged so that chips in the same column in FIG. 1 are in vertical alignment in the memory portion 100 (FIG. 3). It will be remembered that an organization for the memory of FIG. 1 is being assumed such that each row of chips 10 corresponds to a predetermined group of words in the memory, with each column of chips containing bits of like significance for their respective words. It will thus be understood that a selected word in the memory may be accessed by enabling the chips of the chip wafer 25 containing the selected word, and also enabling the particular flip-flop on each thus enabled chip corresponding to the desired word.

The uppermost memory chip wafer 25 in the memory element portion of FIG. 3 may typically contain the first colunm of chips $\mathbf{10}_{1l}$ to $\mathbf{10}_{1m}$ in FIG. 1, the next lower memory chip wafer 25 may typically contain the second row of chips $\mathbf{10}_{2l}$ to $\mathbf{10}_{2m}$ and so on, with the last of nth memory chip wafer 25 at the bottom of the memory portion 100 containing the last column of chips $\mathbf{10}_{nl}$ to $\mathbf{10}_{nm}$. Thus, if it is assumed for illustrative purposes that each chip 10 contains 256 flip-flops (i.e., N = 256 in FIG. 2), and that each memory chip wafer 25 contains 16 chips as illustrated in FIG. 3 (i.e., $m = 16$ in FIG. 1), then each memory chip wafer 25 will be able to provide storage for 256 16-bit words. If, for example, 12 memory chip wafers 25 are provided in the memory portion 100 (i.e., $n = 12$ in FIG. 1), the overall memory will then be able to store 3,072 16-bit words constituting a total of 49,152 bits.

For the specific exemplary memroy assumed above, it will be understood with reference to FIGS. 1 and 2 that 12 leads will be required from the chip selector 14 in order to uniquely enable a desired one of the 12 rows of chips, that eight leads will be required from the chip flip-flop selector 16 in order to uniquely enable a desired one of the 256 flip-flops contained on each enabled chip, and that 16 leads will be required for each of the output and input registers 22 and 24 for the 16 bits to be read from or written into the 16 enabled flip-flops corresponding to the selected word.

As will be apparent from the fragmentary memory chip wafer 25 shown in FIG. 5, provision is illustrated for connection of up to 16 output leads from each chip 10 to respective Z-axis terminals 32 or 32' via respective X-Y conductors. The particular illustrative memory being assumed requires a total of 14 output leads from each chip 10 which may, for example, be provided on each chip 10 as shown in FIG. 5 as follows: eight flip-flop address leads corresponding to lines 16*a* in FIG. 2; one enable lead corresponding to line 14*a* in FIG. 2; one read-write lead corresponding to line 18*a* in FIG. 2; one output lead corresponding to line 22*a* in FIG. 2; one input lead corresponding to line 24*a* in FIG. 2; and two power leads corresponding to lines 19 and 21 in FIG. 2.

The manner in which the required interconnections may typically be provided in accordance with the invention for the above assumed memory will next be considered.

It should initially be recognized that the provision of aligned Z-axis through-terminals 32 on the chip and combined wafers 25 and 27 as described herein is able to provide for the common connection of corresponding chip output terminals in each vertically aligned column of chips in the memory stack 100 (FIG. 3), thereby obviating having to provide any additional connecting means for this purpose. For the memory organization being assumed in which each memroy chip wafer 25 contains the chips 10 corresponding to a respective row in FIG. 1, it will be understood that the only one of the fourteen chip output leads shown in FIG. 5 which should not be commonly connected in each vertically aligned column of chips in the stack of FIG. 3 is the enable lead 14*a,* since each memory chip wafer 25 requires a separate enable line 14*a.* Accordingly, as is indicated in FIGS. 5 and 7, all Z-axis terminals on a memory chip wafer 25 are provided as through-terminals 32, except for each Z-axis terminal 32' which is connected to the enable lead 14*a* of each chip, and the Z-axis terminals 32' provided immediately below the chip output leads 10*a.*

Next to be considered are the X-Y interconnections required to complete the interconnections required for the assumed memory. It will, of course, be understood that, if desired, these required X-Y connections could be provided solely by X-Y conductors provided on stack interconnection wafers 29 (FIG. 3) by interconnecting predetermined ones of the Z-axis through-terminals at the end of the memory element portion 100 of the overall stack 52. However, because batch fabrication techniques can be employed for fabricating the combined and chip wafers 25 and 27 (such as described herein in connection with FIGS. 9 and 10), it is most advantageous to provide all or as many of the required X-Y interconnections as possible using the X-Y conductor capability of one or both of the wafers 25 and 27, so as to thereby eliminate or reduce the number of required interconnection wafers 29. It will, of course, be understood that many different types of X-Y interconnection arrangements may be provided for this purpose, and an example of one possible arrangement will now be described.

It is to be noted from the plan views of the typical chip and combined wafers 25 and 27 illustrated in FIGS. 5, 6 and 8, and most particularly from FIG. 8, that each wafer 25 or 27 is capable of providing two distinct X-Y conductor networks for uniquely connecting in common any two of the chip Z-axis terminals 32 or 32'. Also, where required (such as when Z-axis terminals 32' which are not through-terminals are being connected in common), provision may also be made for connecting such an X-Y network to a free Z-axis through-terminal, such as indicated at **35*a* in FIG. 8 so as to thereby provide for propagation thereof to the ends of the stack for connection to external circuitry. Since it is being assumed that there are 12 memory chip wafers 25 and thus also 12 combined wafers 27**, this capability of providing two X-Y networks on each wafer results in making available a total of at least 48 distinct X-Y networks for providing the required X-Y memory interconnections.

Considering now the number of distinct X-Y interconnection networks actually required for the memory being assumed, it will be understood that 23 such X-Y networks are required as follows: 12 X-Y networks for interconnecting the chip enable leads **12*a* on each of the 12 chip wafers 25, two X-Y networks for commonly interconnecting each of the chip power leads 19 and 20, eight X-Y networks for commonly interconnecting each of respective ones of the eight address leads 16*a* of each chip, and one X-Y network for commonly connecting all of the chip read-write lines 18*a*. With regard to the output and input leads 22*a* and 24*a* of each chip, it will be understood that no X-Y interconnection thereof is required for the assumed memory since, as will be evident from FIG. 1, each is common to a respective column of aligned wafers in the stack so that each will thus already be properly interconnected by its respective Z-axis through-terminals 32**.

The assumed memory thus requires only twenty-three distinct X-Y interconnection networks which can readily be provided in various ways from the 48 available. Thus, for the memory being assumed, all required memory interconnections, including the required X-Y interconnections, may be made within the memory portion 100 (FIG. 3) of the overall memory stack 54 so that the stack interconnection wafers 29 may either be eliminated, or else used in providing some of the interconnections required by the selection and driving circuitry wafers 30. Since it is highly desirable that all of the memory chip wafers 25 be identical for reasons of economy in fabrication, the exemplary assumed embodiment preferably employs only the combined wafers 27 for providing the required 23 distinct X-Y networks, which is one less than the 24 distinct X-Y networks of which they are capable. Thus, although the typical memory chip wafer 25 of FIG. 5 could provide additional X-Y conductors besides those required for connection to the chip output terminals **10*a***, it will be understood that such are not required in the assumed exemplary embodiment being considered herein.

The particular manner in which the 24 X-Y networks available from the twelve combined wafers 27 may be employed for providing the 23 X-Y networks required for the assumed memory is as follows. Each combined wafer 27 will be provided with one X-Y interconnection network for commonly connecting the chip enable leads **14*a* (which it will be remembered are not through-terminals) for that wafer, and for bringing the resulting common connection to a free Z-axis through-terminal which is different for each wafer. Such an X-Y network is typically illustrated in FIG. 8 which shows the resulting common connection being brought, for example, to the free Z-axis through-terminal indicated at 35*a*. The other 11 combined wafers may, for example, bring their resulting common connections to respective ones of the 11 free Z-axis through-terminals in the same row and to the left of terminal 32*a*, as indicated by through-terminals 35*b* – 35*l* in FIG. 8. Thus, each of the twelve enable leads 14*a* will be uniquely available at the ends of the memory portion 100 (FIG. 3) along with the leads 16*a*, 18*a*, 22*a* and 24*a* for connection to their respective units in FIG. 1. As pointed out previously, these units are preferably provided on the selection and driving circuitry wafers 30**.

Besides the one X-Y interconnection network provided on each of the 12 combined wafers 27 for the enable lines **14*a*, 11 combined wafers will additionally have a second X-Y network provided thereon for providing the remaining 11 X-Y interconnections required. FIG. 8, for example, illustrates the provision of a second X-Y network for providing the X-Y interconnections required for commonly connecting all of the read-write leads 18*a* of the memory chips. As pointed out previously, these read-write leads 18*a* are already commonly connected to those on aligned chips of other wafers by their respective Z-axis through-terminals, so that this single X-Y interconnection network is sufficient to connect all in common without requiring connection to a free Z-axis through-terminal, as is done for the enable lead X-Y network. It will be understood that a similar X-Y network to that provided for the read-write leads 18*a* in FIG. 8 is appropriately provided on each of ten other combined wafers 27 for providing the 10 other common connections required for the eight address leads 16*a* and the two power leads 19 and 21 so as to complete the X-Y interconnections required for the memory portion 100**. Of course, if desired, the metal or ground portion of the wafers could be used as one of the power leads.

Typically, each wafer in the memory stack may each be a 1.2 inch square of 18 mils thickness which, in accordance with the present invention, permits obtaining a bit density of 150,000 bits per cubic inch, or even greater.

Although the present invention has been primarily described with respect to particular exemplary embodiments thereof, it is to be understood that many variations and modifications in construction, arrangement, method and use are possible without departing from the spirit of the invention. The invention is accordingly to be considered as including all possible structures and methods coming within the scope of the invention as defined by the appended claims.

The embodiments of the invention in which an exclusive property or privilege is claimed are defined as follows:

1. In a method of making a stacked multi-wafer digital memory, the steps of:

providing a plurality of conductive wafers, selectively removing material from opposite surfaces of each wafer and replacing at least a portion of the removed material with dielectric material so as to form a plurality of spaced electrically insulated Z-axis through-terminals in each wafer supported therein and electrically insulated therefrom by said dielectric material and with at least predetermined ones of said Z-axis terminals being formed as through-terminals located in a like predetermined pattern in each wafer so that respective through-terminals will be aligned when the wafers are stacked, forming a pressure-deformable contact of material more malleable than said wafers on at least one end of each Z-axis through-terminal so that said contact is provided between each aligned pair or Z-axis through-terminals on adjacent wafers when the wafers are stacked, mounting and electrically connecting memory element chips each having a plurality of output leads to predetermined ones of said wafers in a like predetermined manner on each wafer with a majority of the output leads of each chip being electrically connected to respective Z-axis through-terminals of its respective wafer, and stacking said wafers under pressure sufficient to deform said pressure-deformable contacts and thereby form a plurality of insulated coaxially shielded Z-axis conductive paths within the stack electrically interconnecting respective ones of said majority of output leads of said chips.

2. The invention in accordance with claim 1, wherein said method includes forming additional pressure-deformable contacts on the surface of at least one of each pair of adjacent stacked wafers at locations intermediate said Z-axis through-terminals which are likewise deformed during said stacking so as to reliably electrically interconnect said wafers to provide a common ground therefor.

3. The invention in accordance with claim 2, wherein said Z-axis through-terminals and said additional pressure-deformable contacts are provided in predetermined patterns on said wafers so as to provide for substantially uniform pressure distribution during stacking.

4. The invention in accordance with claim 1, wherein the step of selectively removing is such as to also form X-Y conductors in predetermined ones of said wafers electrically connected to predetermined ones of the Z-axis terminals of their respective wafers.

5. The invention in accordance with claim 4, wherein each of said X-Y conductors is formed so as to be recessed from both surfaces of its respective wafer.

6. The invention in accordance with claim 1, wherein the step of selectively removing is accomplished by selective chemical etching.

7. The invention in accordance with claim 6, wherein the step of stacking is such that the predetermined ones of said wafers to which said memory chips are mounted are stacked in an alternating arrangement with second predetermined ones of said wafers containing no memory chip elements.

8. The invention in accordance with claim 7, wherein said second predetermined ones of said wafers are additionally formed so as to provide recesses for accommodating projecting portions of memory chip elements on adjacent wafers during said stacking.

* * * * *